(12) United States Patent  
Shin et al.

(10) Patent No.: US 8,318,541 B2
(45) Date of Patent: Nov. 27, 2012

(54) SEMICONDUCTOR DEVICE AND METHOD OF FORMING VERTICAL INTERCONNECT IN FO-WLCSP USING LEADFRAME DISPOSED BETWEEN SEMICONDUCTOR DIE

(75) Inventors: HanGil Shin, Gyeonggi-do (KR); NamJu Cho, Gyeonggi-do (KR); HeeJo Chi, Daejeon-si (KR)

(73) Assignee: STATS ChipPAC, Ltd., Singapore (SG)

( * ) Notice: Subject to any disclaimer, the term of this patent is extended or adjusted under 35 U.S.C. 154(b) by 67 days.

(21) Appl. No.: 12/853,865

(22) Filed: Aug. 10, 2010

(65) Prior Publication Data

US 2012/0038034 A1 Feb. 16, 2012

(51) Int. Cl.
*H01L 21/50* (2006.01)
*H01L 21/60* (2006.01)

(52) U.S. Cl. ............... 438/113; 438/107; 257/E21.506; 257/E21.499

(58) Field of Classification Search .................. None
See application file for complete search history.

(56) References Cited

U.S. PATENT DOCUMENTS

| | | | |
|---|---|---|---|
| 8,138,014 B2 * | 3/2012 | Chi et al. | ....................... 438/106 |
| 2006/0170098 A1 | 8/2006 | Hsu | |
| 2009/0315170 A1 | 12/2009 | Shim et al. | |
| 2010/0006994 A1 | 1/2010 | Shim et al. | |

* cited by examiner

*Primary Examiner* — Seahvosh Nikmanesh
(74) *Attorney, Agent, or Firm* — Robert D. Atkins; Patent Law Group: Atkins & Associates, P.C.

(57) ABSTRACT

A semiconductor device has a plurality of semiconductor die or components mounted over a carrier. A leadframe is mounted over the carrier between the semiconductor die. The leadframe has a plate and bodies extending from the plate. The bodies of the leadframe are disposed around a perimeter of the semiconductor die. An encapsulant is deposited over the carrier, leadframe, and semiconductor die. A plurality of conductive vias is formed through the encapsulant and electrically connected to the bodies of the leadframe and contact pads on the semiconductor die. An interconnect structure is formed over the encapsulant and electrically connected to the conductive vias. A first channel is formed through the interconnect structure, encapsulant, leadframe, and partially through the carrier. The carrier is removed to singulate the semiconductor die. A second channel is formed through the plate of the leadframe to physically separate the bodies of the leadframe.

19 Claims, 13 Drawing Sheets

SEMICONDUCTOR DEVICE AND METHOD OF FORMING VERTICAL INTERCONNECT IN FO-WLCSP USING LEADFRAME DISPOSED BETWEEN SEMICONDUCTOR DIE

FIELD OF THE INVENTION

The present invention relates in general to semiconductor devices and, more particularly, to a semiconductor device and method of forming a vertical interconnect in a FO-WLCSP using a leadframe disposed between the semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a fan-out wafer level chip scale package (FO-WLCSP), an encapsulant is formed around a semiconductor die and a build-up interconnect structure is formed over one or both sides of the encapsulant. A plurality of conductive vias is formed through the encapsulant adjacent to the semiconductor die for vertical (z-direction) electrical interconnect between the topside build-up interconnect structure and bottom side build-up interconnect structure. The vertical conductive vias add manufacturing time and costs, as well as reducing reliability as via formation is prone to defects.

SUMMARY OF THE INVENTION

A need exists to provide vertical electrical interconnect in a FO-WLCSP without forming conductive vias. Accordingly, in one embodiment, the present invention is a method of making a semiconductor device comprising the steps of providing a temporary carrier, mounting a plurality of semiconductor die or components over the temporary carrier, and mounting a prefabricated leadframe over the temporary carrier between the semiconductor die or components. The leadframe has a plate and bodies extending from the plate. The method further includes the steps of depositing an encapsulant over the temporary carrier, leadframe, and semiconductor die or components, forming a plurality of conductive vias through the encapsulant and electrically connected to the bodies of the leadframe and contact pads on the semiconductor die or components, forming an interconnect structure over the encapsulant and electrically connected to the conductive vias, forming a first channel through the interconnect structure, encapsulant, leadframe, and partially through the temporary carrier, and removing the temporary carrier to singulate the semiconductor die or components.

In another embodiment, the present invention is a method of making a semiconductor device comprising the steps of providing a first carrier, mounting a semiconductor die or component over the first carrier, and mounting a leadframe over the first carrier adjacent to the semiconductor die or component. The leadframe has a plate and bodies extending from the plate. The method further includes the steps of depositing an encapsulant over the first carrier, leadframe, and semiconductor die or component, forming a plurality of conductive vias through the encapsulant and electrically connected to the bodies of the leadframe and contact pads on the semiconductor die or component, and forming a first interconnect structure over a first surface of the encapsulant and electrically connected to the conductive vias.

In another embodiment, the present invention is a method of making a semiconductor device comprising the steps of providing a first semiconductor die or component, and disposing a first leadframe around the first semiconductor die or component. The first leadframe has a plate and bodies extending from the plate. The method further includes the steps of depositing a first encapsulant over the first leadframe and first semiconductor die or component, and forming a first interconnect structure over the first encapsulant and electrically connected to the first leadframe and first semiconductor die or component.

In another embodiment, the present invention is a semiconductor device comprising a first semiconductor die or component and first leadframe disposed around the first semiconductor die or component. The first leadframe has a plate and bodies extending from the plate. A first encapsulant is deposited over the first leadframe and first semiconductor die or component. A first interconnect structure is formed over the first encapsulant and electrically connected to the first leadframe and first semiconductor die or component.

DETAILED DESCRIPTION OF THE DRAWINGS

Figure 1:
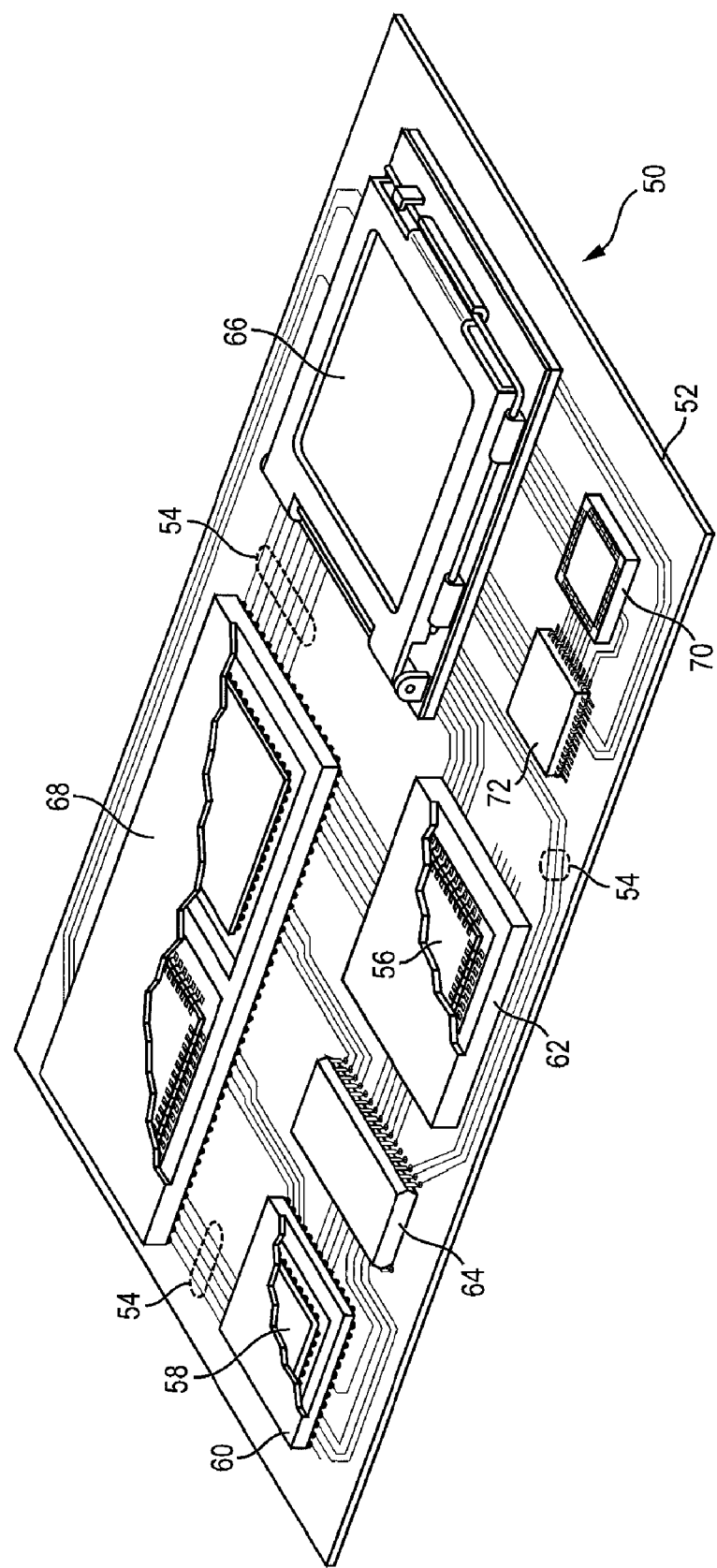
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
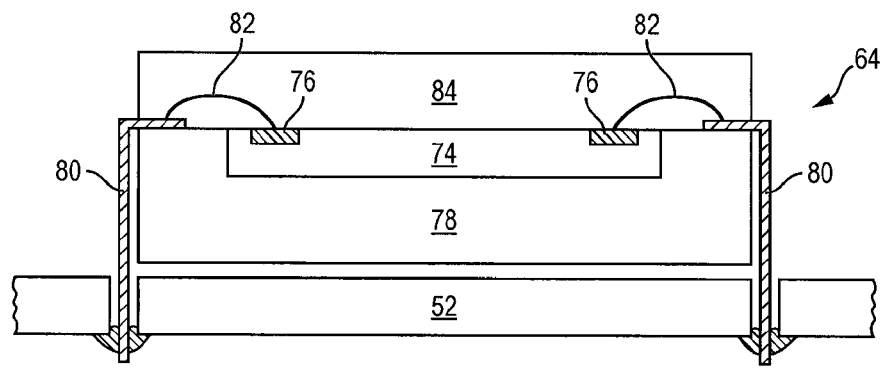
FIGS. 2a-2c illustrate further detail of the representative semiconductor packages mounted to the PCB.
Figure 2B:
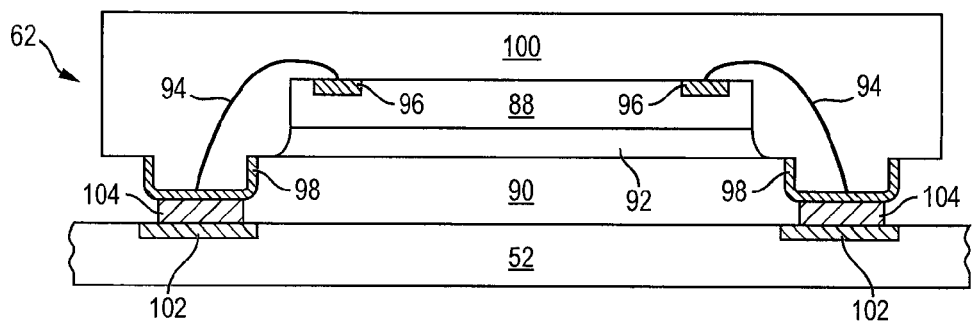
Figure 2C:
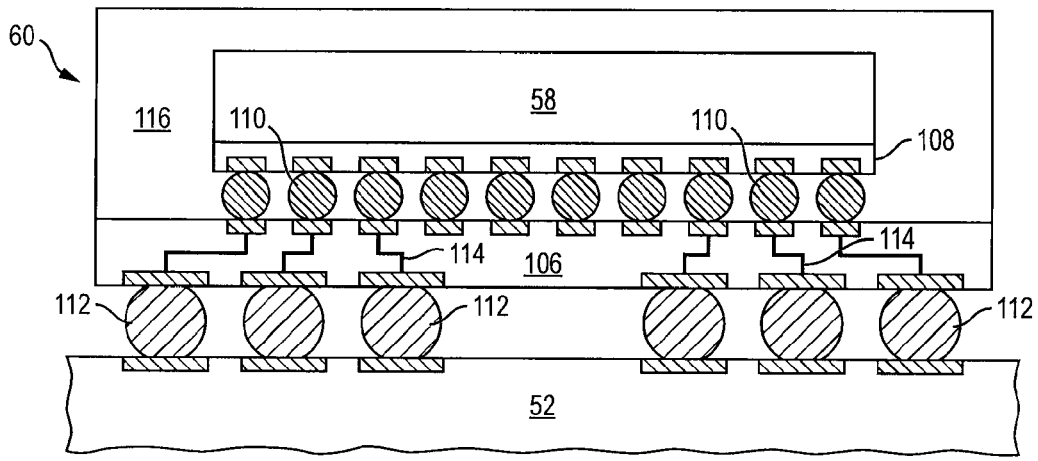

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
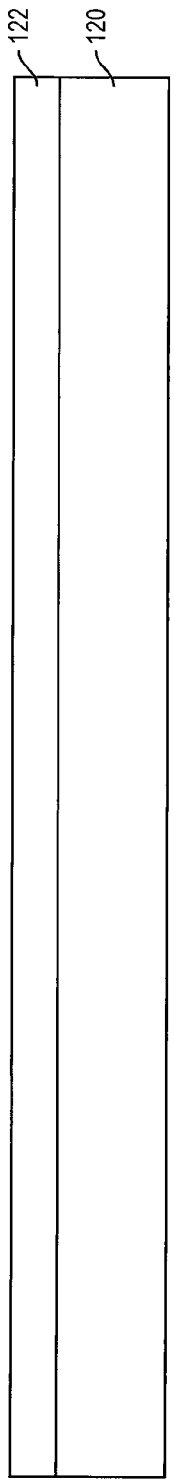
FIGS. 3a-3f illustrate a process of forming a vertical interconnect in a 2-sided FO-WLCSP using a leadframe disposed between the semiconductor die.

FIGS. 3a-3f illustrate, in relation to FIGS. 1 and 2a-2c, a process of forming a vertical electrical interconnect in a FO-WLCSP using a leadframe disposed between the semiconductor die. In FIG. 3a, a sacrificial or temporary substrate or carrier 120 contains base material such as glass, glass epoxy, or other suitable low-cost, rigid material for structural support. In one embodiment, carrier 120 is transparent or translucent. A transparent or translucent adhesive layer 122 is applied over a surface of carrier 120.

Figure 3B:
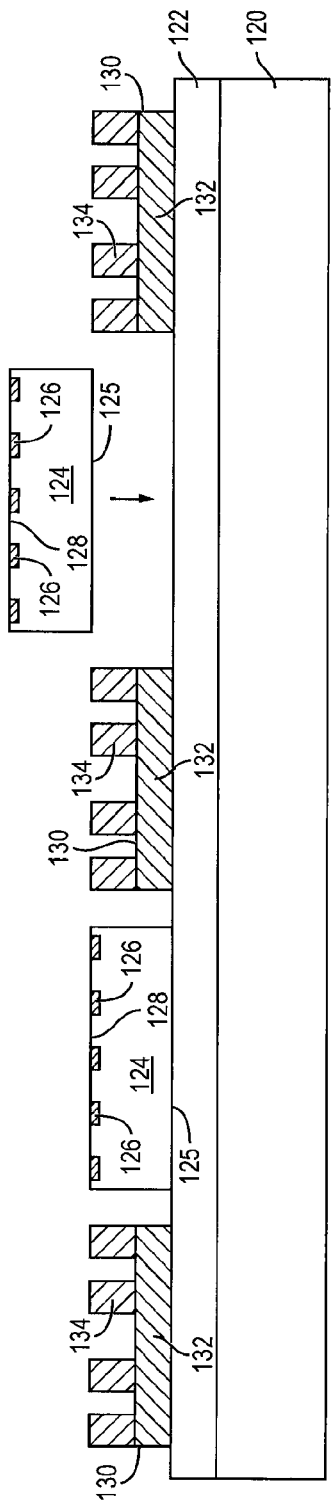

In FIG. 3b, a plurality of semiconductor die or components 124 is mounted to carrier 120 using a pick and place operation with back surface 125 oriented toward the carrier and contact pads 126 oriented away from the carrier. Semiconductor die 124 each include an active region 128 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement baseband analog circuits or digital circuits, such as digital signal processor (DSP), ASIC, memory, or other signal processing circuit. Semiconductor die 124 may also contain IPD, such as inductors, capacitors, and resistors, for RF signal processing. Semiconductor die 124 can be a flipchip type device. In another embodiment, a discrete component can be mounted over carrier 120.

A prefabricated leadframe 130 is mounted over adhesive layer 122 between semiconductor die 124. In one embodiment, prefabricated leadframe 130 is made with Cu. Leadframe 130 includes a flat plate 132 with a plurality of bodies 134 integrated with and extending from the flat plate. The flat plate 132 and bodies 134 are sufficiently thick to extend from adhesive layer 122 to active surface 128. Leadframe 130 extends around a perimeter of semiconductor die 124.

Figure 3C:
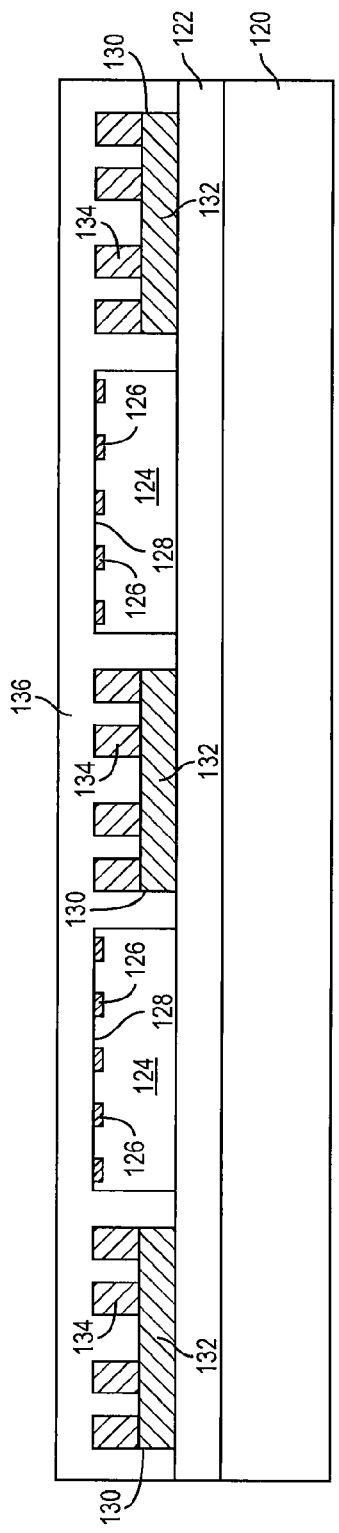

FIG. 3c shows an encapsulant or molding compound 136 deposited over carrier 120, semiconductor die 124, and prefabricated leadframe 130 using a paste printing, compressive molding, transfer molding, liquid encapsulant molding, vacuum lamination, or other suitable applicator. Encapsulant 136 can be polymer composite material, such as epoxy resin with filler, epoxy acrylate with filler, or polymer with proper filler. Encapsulant 136 is non-conductive and environmentally protects the semiconductor device from external elements and contaminants. Encapsulant 136 encloses semiconductor die 124, plate 132, and bodies 134.

Figure 3D:
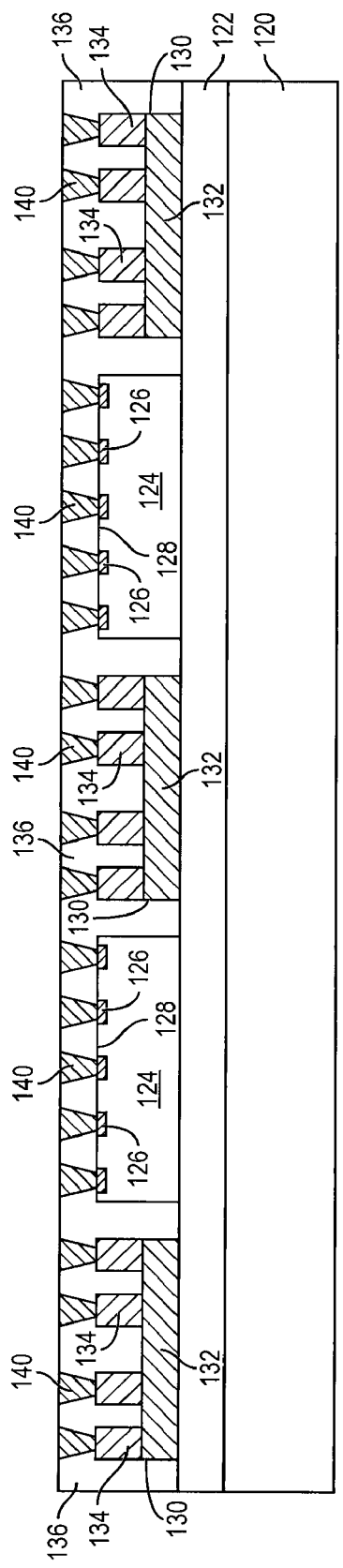

In FIG. 3d, a plurality of vias is formed partially through encapsulant 136 down to bodies 134 and contact pads 126 using mechanical drilling, laser drilling, or deep reactive ion etching (DRIE). The vias are filled with Al, Cu, Sn, Ni, Au, Ag, Ti, tungsten (W), poly-silicon, or other suitable electrically conductive material using electrolytic plating, electroless plating process, or other suitable metal deposition process to form conductive vias 140. The conductive vias 140 represent a first level redistribution layer (RDL) electrically connected to bodies 134 and contact pads 126 of semiconductor die 124.

Figure 3E:
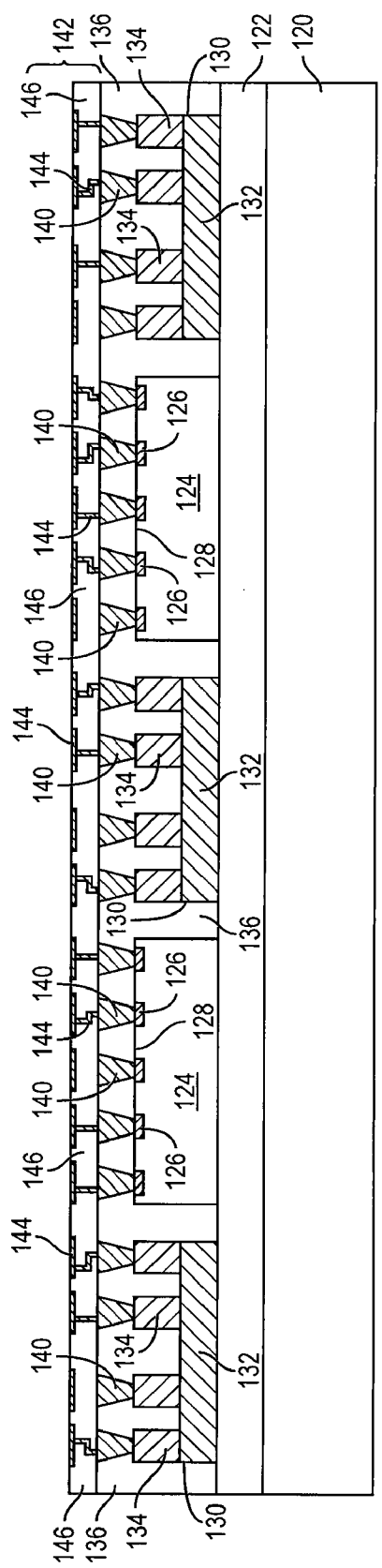

In FIG. 3e, a build-up interconnect structure 142 is formed over encapsulant 136 and conductive vias 140. The build-up interconnect structure 142 includes an electrically conductive layer 144 formed using a patterning and metal deposition process such as sputtering, electrolytic plating, and electroless plating. Conductive layer 144 can be one or more layers of Al, Cu, Sn, Ni, Au, Ag, or other suitable electrically conductive material. One portion of conductive layer 144 is a second level RDL electrically connected to conductive vias 140. Other portions of conductive layer 144 can be electrically common or electrically isolated depending on the design and function of semiconductor die 124.

The build-up interconnect structure 142 further includes an insulating or passivation layer 146 formed over and between conductive layers 144 for electrical isolation. The insulating layer 146 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 146 is formed using PVD, CVD, printing, spin coating, spray coating, sintering or thermal oxidation. A portion of insulating layer 146 is removed to expose conductive layer 144 for bump formation or other external interconnect.

Figure 3F:
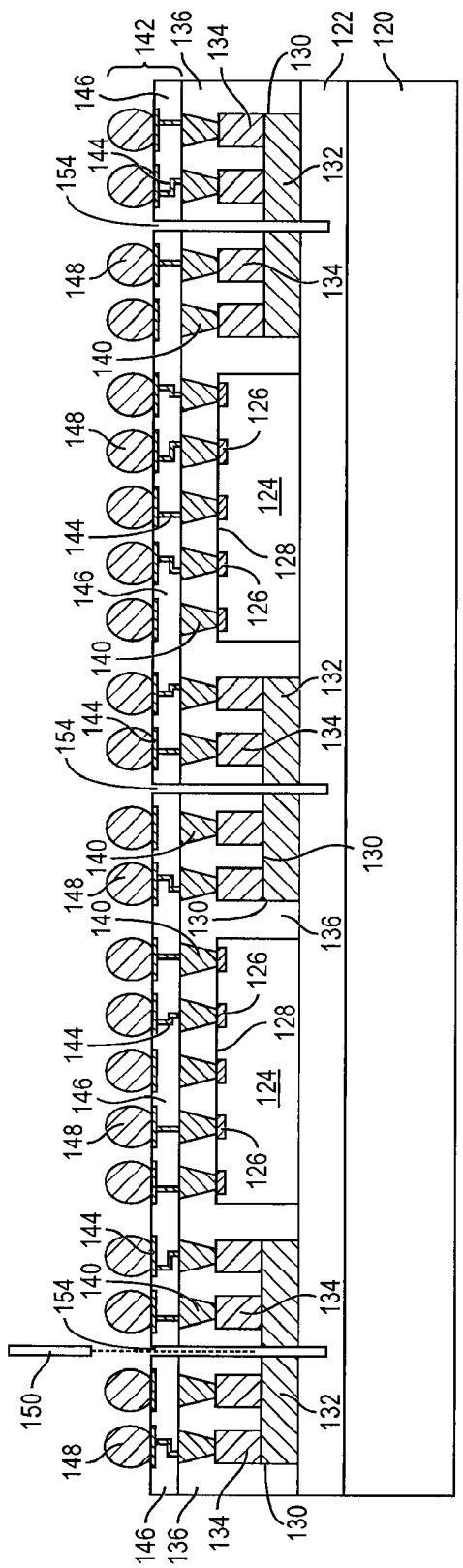

In FIG. 3f, an electrically conductive bump material is deposited over build-up interconnect structure 142 and electrically connected to conductive layer 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 148. In some applications, bumps 148 are reflowed a second time to improve electrical contact to conductive layer 144. An under bump metallization can be formed under bumps 148. The bumps can also be compression bonded to conductive layer 144. Bumps 148 represent one type of interconnect structure that can be formed over conductive layer 144. The interconnect structure can also use bond wires, stud bump, micro bump, or other electrical interconnect.

Figure 4A:
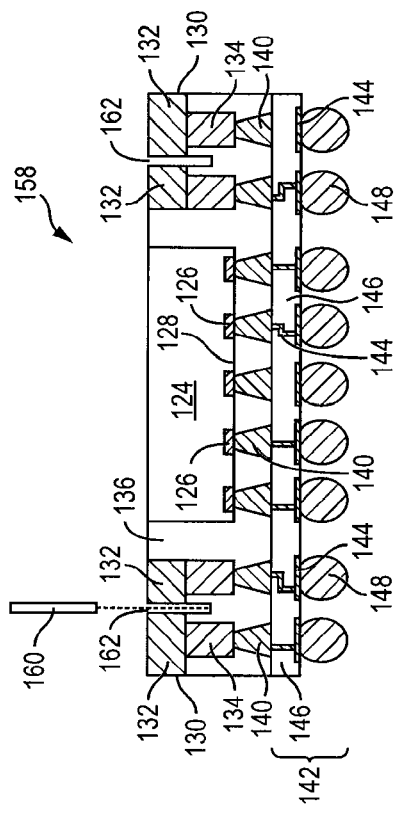
FIGS. 4a-4b illustrate the FO-WLCSP with vertical interconnect formed by a leadframe disposed between the semiconductor die.
Figure 4B:
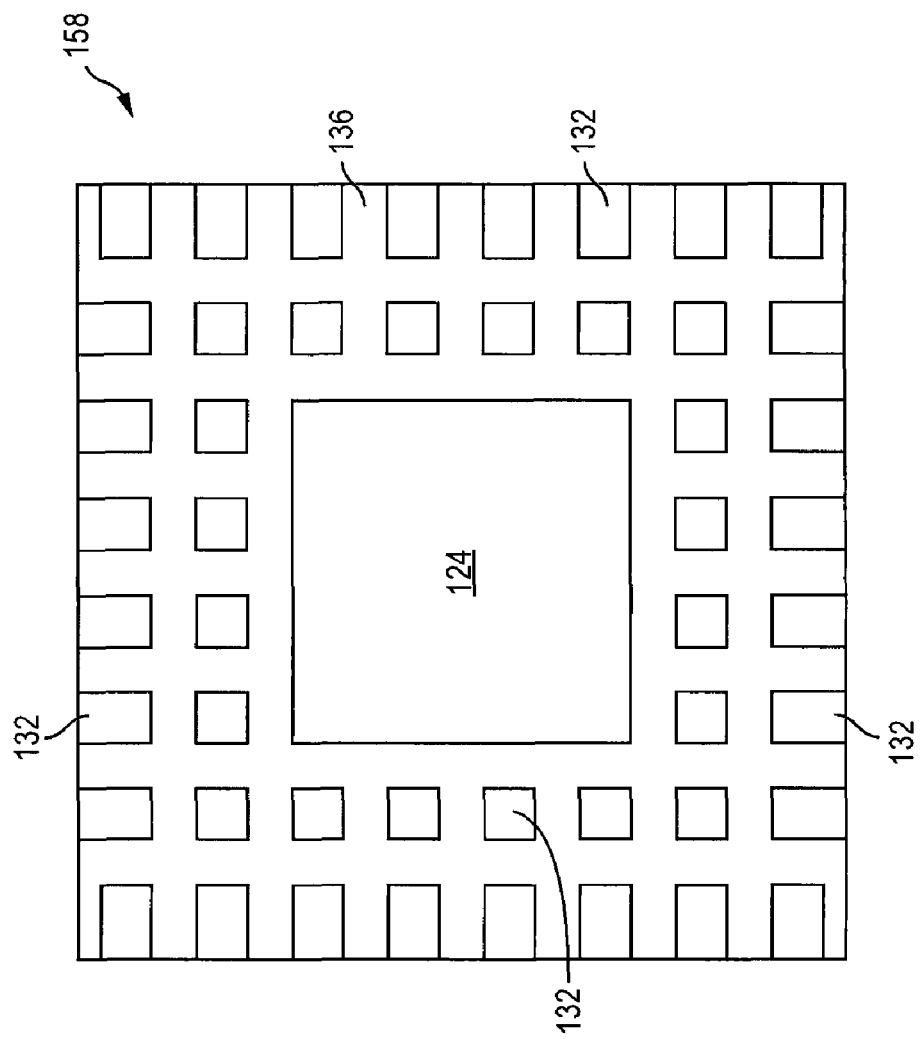

A laser cutting tool or saw blade 150 cuts channels 154 through build-up interconnect structure 142, encapsulant 136, leadframe 130, and partially through adhesive layer 122 or carrier 120. Semiconductor die 124 are singulated into individual 2-sided FO-WLCSP 158 by removing temporary carrier 120 and adhesive layer 122 using chemical etching, mechanical peel-off, CMP, mechanical grinding, thermal bake, laser scanning, or wet stripping. After singulation, FO-WLCSP 158 has leadframe 130 disposed around a perimeter of semiconductor die 124, as shown in the cross-sectional view of FIG. 4a and top view of FIG. 4b. Bodies 134 and plate 132 of leadframe 130 provide vertical (z-direction) electrical interconnect to conductive vias 140 and build-up interconnect structure 142. A laser cutting tool or saw blade 160 cuts channels 162 through plate 132 to electrically separate bodies 134. Cutting channels 162 is optional and may not be required for all packages. For example, channels 162 may not be cut for quad flat no-lead dual row (QFN-dr) type packages. Accordingly, semiconductor die 124 is electrically connected through conductive vias 140 to build-up interconnect structure 142 and portions of leadframe 130. The use of leadframe 130 for vertical electrical interconnect reduces manufacturing cycle time, lowers cost, and provides improved interconnect quality and reliability. In addition, glass carrier 120 and transparent adhesive layer 122 allows for fine alignment of semiconductor die 124 and leadframe 130, as well as improved control of the process for conductive vias 140 and conductive layer 144.

Figure 5A:
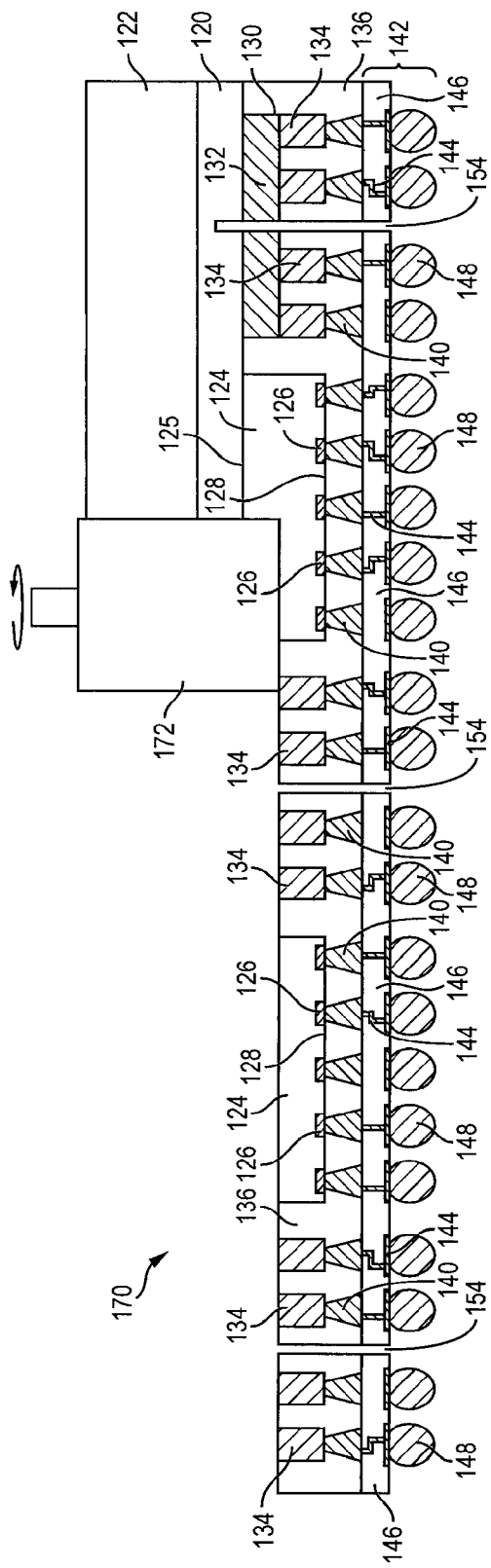
FIGS. 5a-5b illustrate another process of singulating the leadframe to form the vertical interconnect in the FO-WLCSP.
Figure 5B:
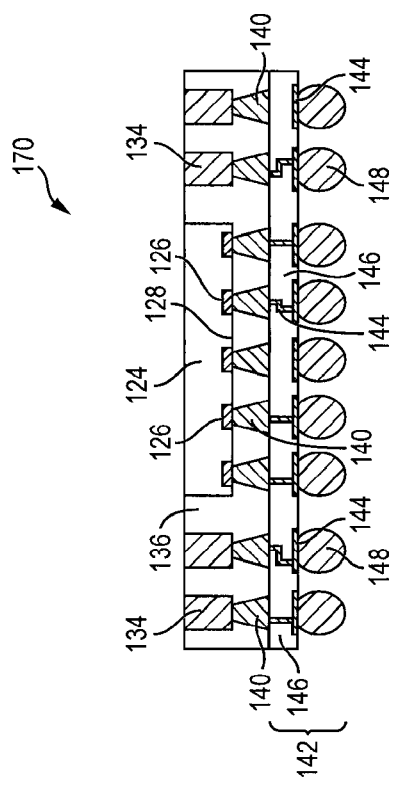

FIG. 5a shows another embodiment of FO-WLCSP 170, continuing from FIG. 3f, with semiconductor die 124 singulated by using grinding wheel 172 to remove temporary carrier 120 and adhesive layer 122, as well as plate 132 and a portion of back surface 125 of semiconductor die 124. After singulation, FO-WLCSP 170 has bodies 134 of leadframe 130 disposed around a perimeter of semiconductor die 124, as shown in the cross-sectional view of FIG. 5b. Bodies 134 provide vertical electrical interconnect to conductive vias 140 and build-up interconnect structure 142. Bodies 134 are electrically separate by nature of removing plate 132. Accordingly, semiconductor die 124 is electrically connected through conductive vias 140 to build-up interconnect structure 142 and bodies 134. Removing a portion of back surface 125 of semiconductor die 124 reduces the thickness of FO-WLCSP 170. The use of leadframe 130 for vertical electrical interconnect reduces manufacturing cycle time, lowers cost, and provides improved interconnect quality and reliability.

Figure 6A:
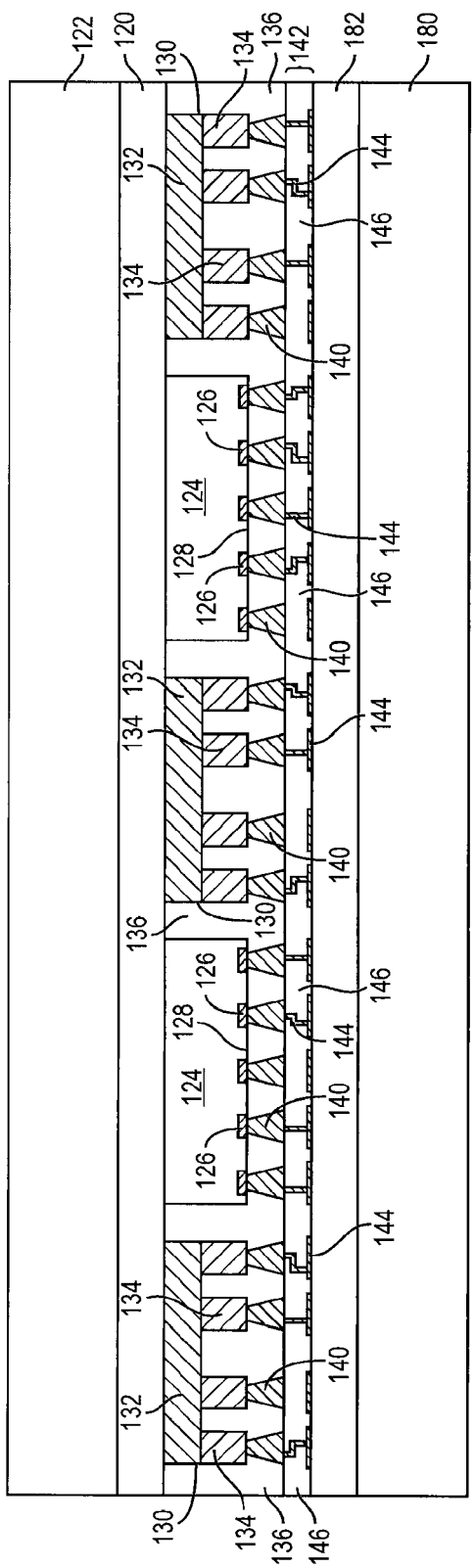
FIGS. 6a-6e illustrate a process of forming a vertical interconnect in a dual face 3D FO-WLCSP using a leadframe disposed between multiple semiconductor die.

FIGS. 6a-6e show a process of forming a vertical electrical interconnect in a dual face 3D FO-WLCSP using a leadframe disposed between the semiconductor die. Continuing from FIG. 3e, a sacrificial or temporary substrate or carrier 180 contains base material such as glass, glass epoxy, or other suitable low-cost, rigid material for structural support, as shown in FIG. 6a. In one embodiment, carrier 120 is transparent or translucent. A transparent or translucent adhesive layer 182 is applied over a surface of carrier 180. Leading with build-up interconnect structure 142, the structure from FIG. 3e is mounted to adhesive layer 182.

Figure 6B:
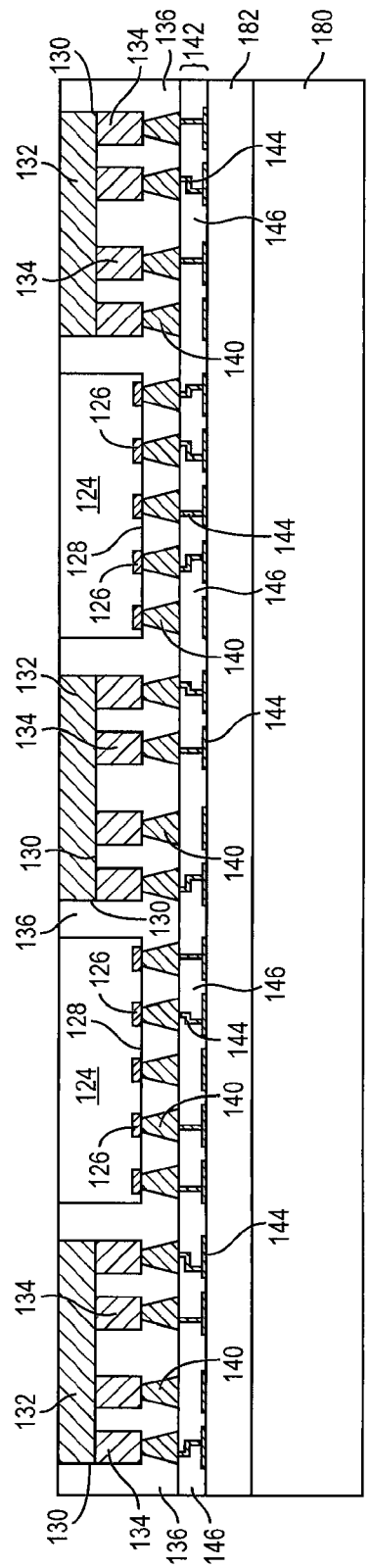

In FIG. 6b, carrier 120 and adhesive layer 122 are removed by chemical etching, mechanical peel-off, CMP, mechanical grinding, thermal bake, laser scanning, or wet stripping.

Figure 6C:
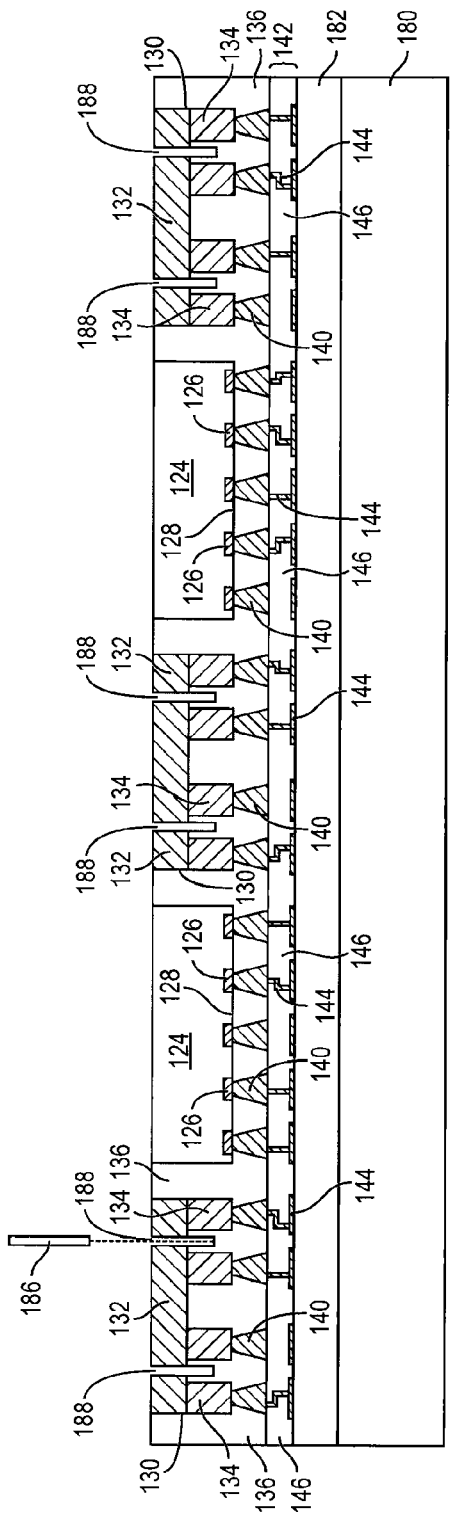

In FIG. 6c, a laser cutting tool or saw blade 186 cuts channels 188 through plate 132 to electrically separate bodies 134. Cutting channels 188 is optional and may not be required for all packages. For example, channels 188 may not be cut for QFN-dr type packages.

Figure 6D:
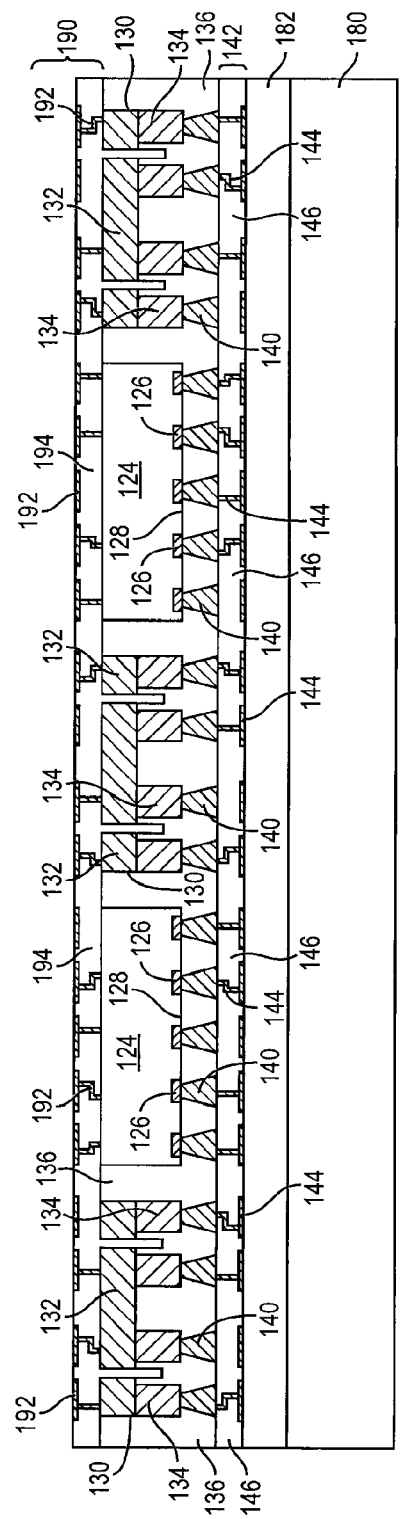

In FIG. 6d, a build-up interconnect structure 190 is formed over encapsulant 136 and back surface 125 of semiconductor die 124. The build-up interconnect structure 190 includes an electrically conductive layer 192 formed using a patterning and metal deposition process such as sputtering, electrolytic plating, and electroless plating. Conductive layer 192 can be one or more layers of Al, Cu, Sn, Ni, Au, Ag, or other suitable electrically conductive material. One portion of conductive layer 192 is electrically connected to plate 132 of leadframe 130. Other portions of conductive layer 192 can be electrically common or electrically isolated depending on the design and function of semiconductor die 124.

The build-up interconnect structure 190 further includes an insulating or passivation layer 194 formed between conductive layers 192 and extending into channels 188 for electrical isolation. The insulating layer 194 contains one or more layers of SiO2, Si3N4, SiON, Ta2O5, Al2O3, or other material having similar insulating and structural properties. The insulating layer 194 is formed using PVD, CVD, printing, spin coating, spray coating, sintering or thermal oxidation. A portion of insulating layer 194 is removed to expose conductive layer 192 for bump formation or other external interconnect.

Figure 6E:
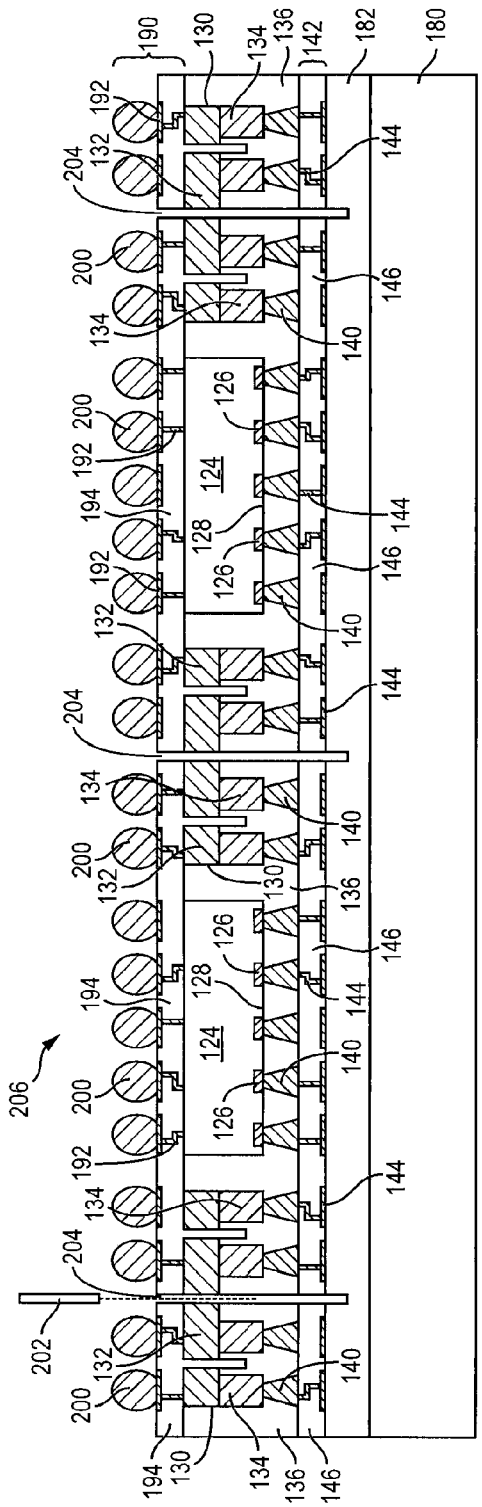

In FIG. 6e, an electrically conductive bump material is deposited over build-up interconnect structure 190 and electrically connected to conductive layer 192 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 192 using a suitable attachment or bonding process. In one embodiment, the bump material is reflowed by heating the material above its melting point to form spherical balls or bumps 200. In some applications, bumps 200 are reflowed a second time to improve electrical contact to conductive layer 192. An under bump metallization can be formed under bumps 200. The bumps can also be compression bonded to conductive layer 192. Bumps 200 represent one type of interconnect structure that can be formed over conductive layer 192. The interconnect structure can also use bond wires, stud bump, micro bump, or other electrical interconnect.

Figure 7:
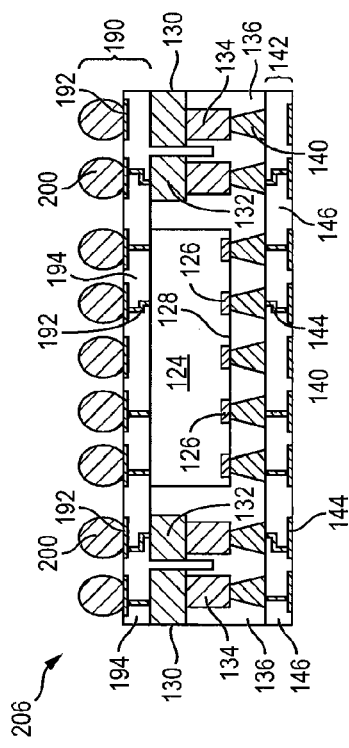
FIG. 7 illustrates the dual face 3D FO-WLCSP with vertical interconnect formed by a leadframe disposed between the semiconductor die.

A laser cutting tool or saw blade 202 cuts channels 204 through build-up interconnect structure 190, leadframe 130, encapsulant 136, and partially through adhesive layer 182 or carrier 180. Semiconductor die 124 are singulated into individual dual face 3D FO-WLCSP 206 by removing temporary carrier 180 and adhesive layer 182 using chemical etching, mechanical peel-off, CMP, mechanical grinding, thermal bake, laser scanning, or wet stripping. After singulation, FO-WLCSP 206 has leadframe 130 disposed around a perimeter of semiconductor die 124, as shown in FIG. 7. Bodies 134 and plate 132 of leadframe 130 provide vertical electrical interconnect to conductive vias 140 and build-up interconnect structures 142 and 190. Accordingly, semiconductor die 124 is electrically connected through conductive vias 140 to leadframe 130 and build-up interconnect structures 142 and 190. The use of leadframe 130 for vertical electrical interconnect reduces manufacturing cycle time, lowers cost, and provides improved interconnect quality and reliability.

Figure 8A:
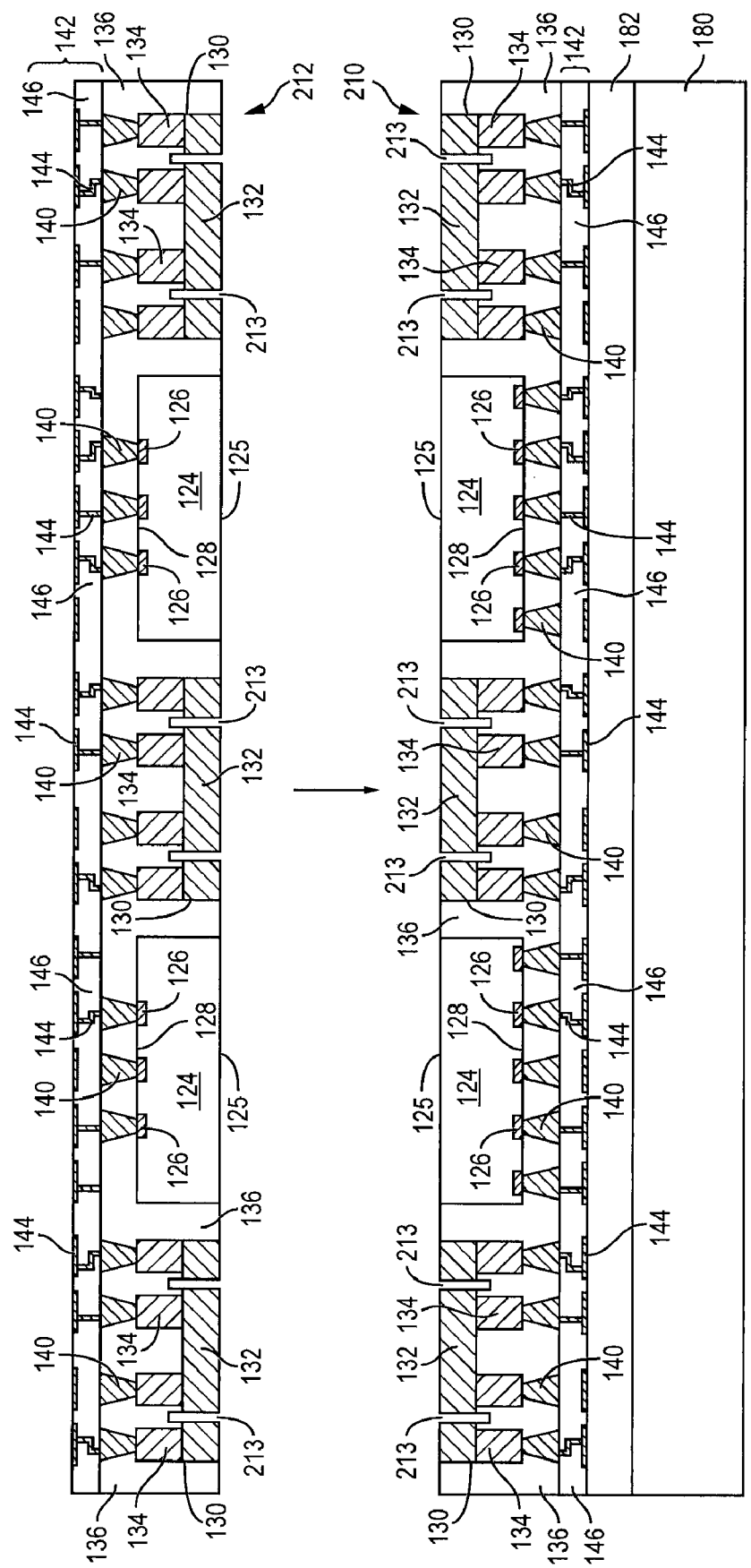
FIGS. 8a-8b illustrate a process of forming a vertical interconnect in a high aspect ratio 3D multi-die FO-WLCSP using a leadframe disposed over multiple semiconductor die.
Figure 8B:
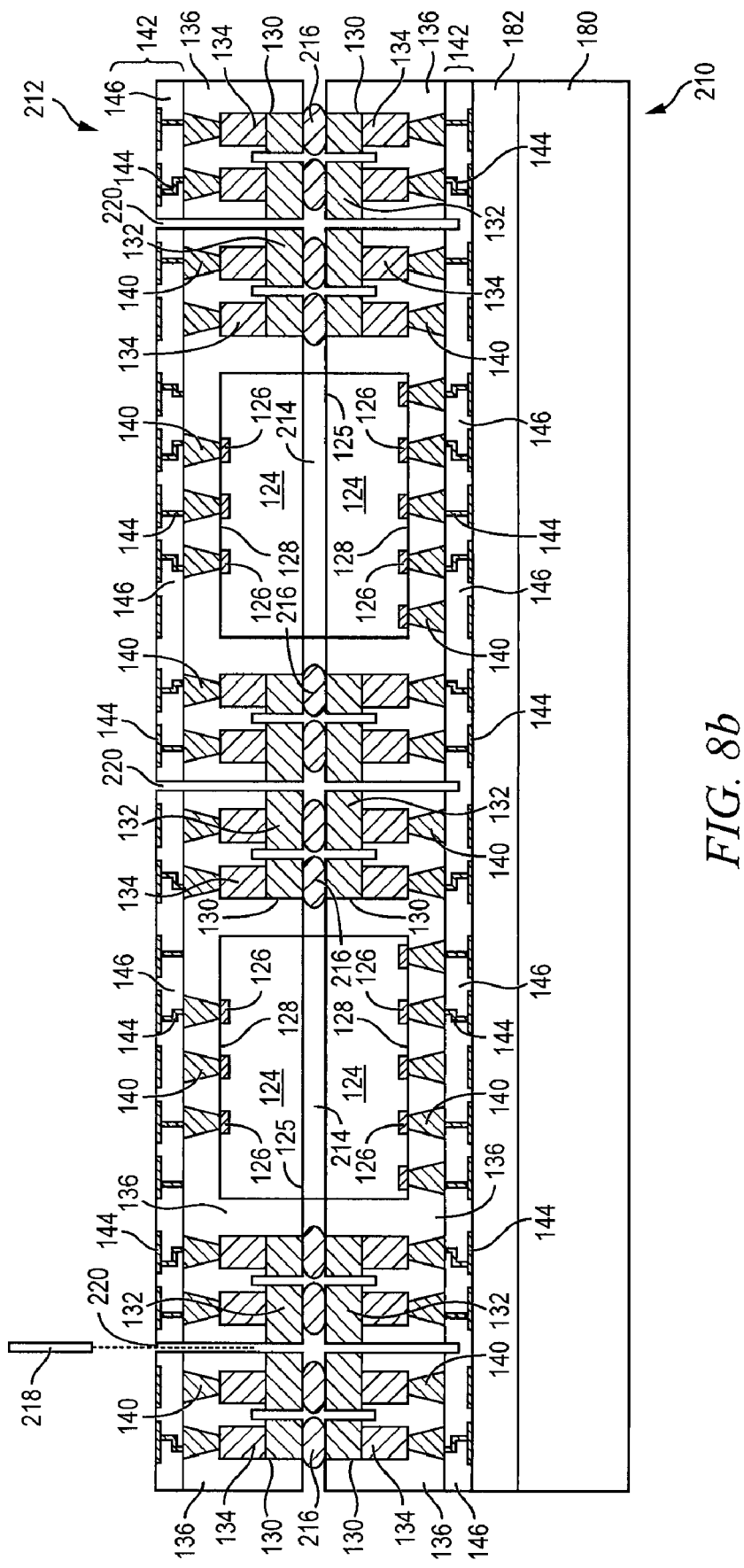

FIGS. 8a-8b show a process of forming a vertical electrical interconnect in a high aspect ratio 3D multi-die FO-WLCSP using a leadframe disposed between the semiconductor die. In FIG. 8a, a first FO-WLCSP 210 with leadframe vertical electrical interconnect, configured similar to FIG. 6b, is aligned with a second FO-WLCSP 212 with leadframe vertical electrical interconnect, configured similar to FIG. 3e, but without carrier 120 and adhesive layer 122. A plurality of channels 213 can be cut through plate 132 to electrically separate bodies 134.

In FIG. 8b, FO-WLCSP 212 is mounted to FO-WLCSP 210 with die attach adhesive 214 bonding back surfaces 125 of semiconductor die 124 of each FO-WLCSP. Plate 132 of FO-WLCSP 210 is electrically connected to plate 132 of FO-WLCSP 212 with a solder paste or conductive epoxy 216.

Figure 9:
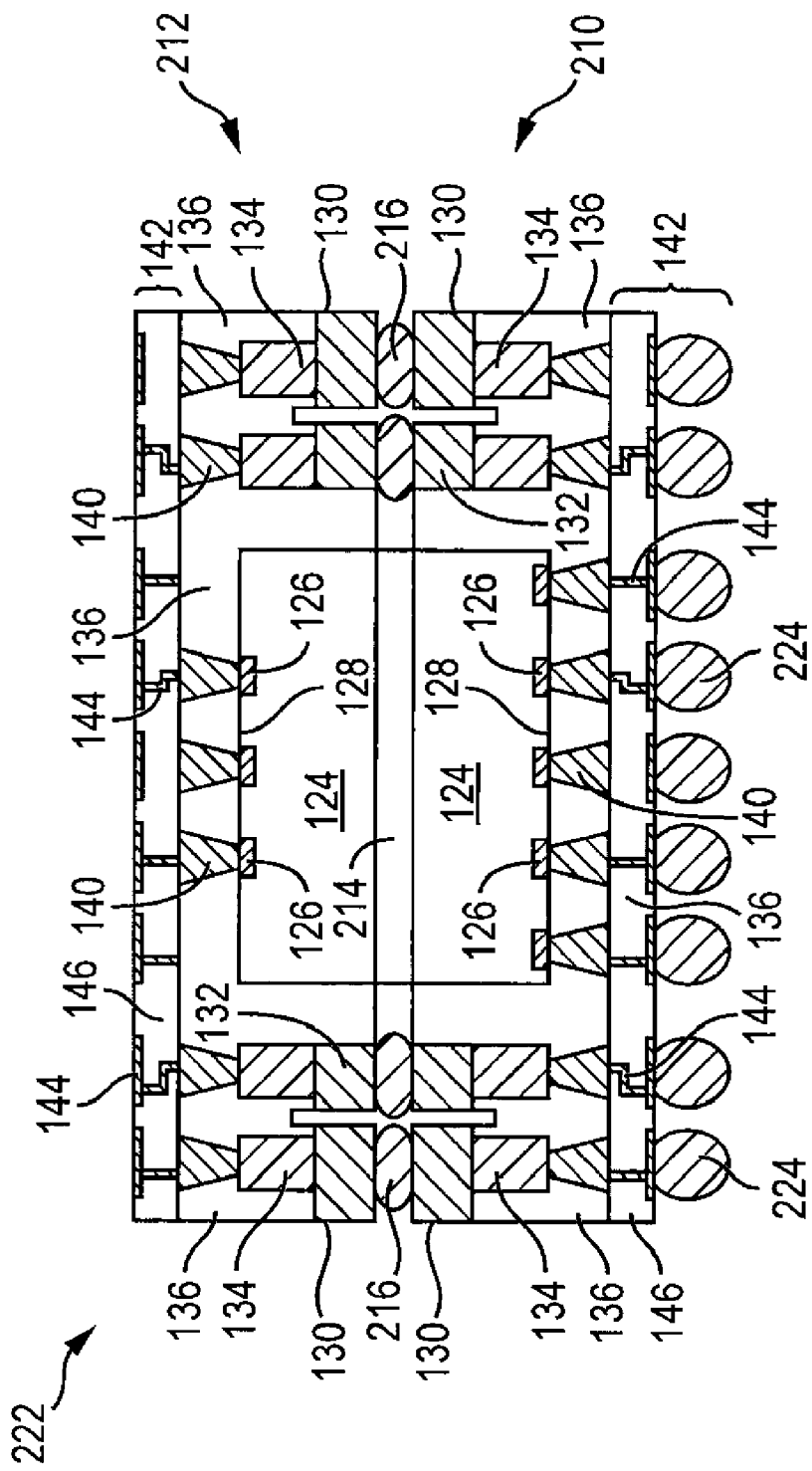
FIG. 9 illustrates the multi-die FO-WLCSP with vertical interconnect formed by a leadframe disposed between the semiconductor die.

A laser cutting tool or saw blade 218 cuts channels 220 through build-up interconnect structure 142, leadframe 130, encapsulant 136, and partially through adhesive layer 182 or carrier 180. Semiconductor die 124 are singulated into multi-die FO-WLCSP 222 by removing temporary carrier 180 and adhesive layer 182 using chemical etching, mechanical peel-off, CMP, mechanical grinding, thermal bake, laser scanning, or wet stripping. After singulation, FO-WLCSP 222 has leadframe 130 disposed around a perimeter of semiconductor die 124, as shown in FIG. 9. Bodies 134 and plate 132 of leadframes 130 provide vertical electrical interconnect to conductive vias 140 and build-up interconnect structures 142. Accordingly, semiconductor die 124 is electrically connected through conductive vias 140 to leadframes 130 and build-up interconnect structures 142. The use of leadframe 130 for vertical electrical interconnect reduces manufacturing cycle time, lowers cost, and provides improved interconnect quality and reliability. In addition, the glass carrier and transparent adhesive layer allows for fine alignment of semiconductor die 124 and leadframe 130, as well as improved control of the RDL formation.

An electrically conductive bump material is deposited over build-up interconnect structure 142 and electrically connected to conductive layer 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 224. In some applications, bumps 224 are reflowed a second time to improve electrical contact to conductive layer 144. An under bump metallization can be formed under bumps 224. The bumps can also be compression bonded to conductive layer 144. Bumps 224 represent one type of interconnect structure that can be formed over conductive layer 144. The interconnect structure can also use bond wires, stud bump, micro bump, or other electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a temporary carrier;
   mounting a plurality of semiconductor die or components over the temporary carrier;
   mounting a prefabricated leadframe over the temporary carrier between the semiconductor die or components, the leadframe including a plate and bodies extending from the plate;
   depositing an encapsulant over the temporary carrier, leadframe, and semiconductor die or components;
   forming a plurality of conductive vias through the encapsulant and electrically connected to the bodies of the leadframe and contact pads on the semiconductor die or components;
   forming an interconnect structure over the encapsulant and electrically connected to the conductive vias;
   forming a first channel through the interconnect structure, encapsulant, leadframe, and partially through the temporary carrier; and
   removing the temporary carrier to singulate the semiconductor die or components.

2. The method of claim 1, further including forming a second channel through the plate of the leadframe to physically separate the bodies of the leadframe.

3. The method of claim 1, wherein the bodies of the leadframe are disposed around a perimeter of each semiconductor die or component.

4. The method of claim 1, further including stacking a plurality of semiconductor die or components within the semiconductor device.

5. The method of claim 1, further including removing the temporary carrier and the plate of the leadframe to singulate the semiconductor die or components.

6. A method of making a semiconductor device, comprising:
   providing a first carrier;
   mounting a semiconductor die or component over the first carrier;
   mounting a leadframe over the first carrier adjacent to the semiconductor die or component, the leadframe including a plate and bodies extending from the plate;
   depositing an encapsulant over the first carrier, leadframe, and semiconductor die or component;
   forming a plurality of conductive vias through the encapsulant and electrically connected to the bodies of the leadframe and contact pads on the semiconductor die or component; and
   forming a first interconnect structure over a first surface of the encapsulant and electrically connected to the conductive vias.

7. The method of claim 6, further including:
   forming a channel through the first interconnect structure, encapsulant, leadframe, and partially through the first carrier; and
   removing the first carrier to singulate the semiconductor die or component.

8. The method of claim 6, further including forming a channel through the plate of the leadframe to physically separate the bodies of the leadframe.

9. The method of claim 6, wherein the bodies of the leadframe are disposed around a perimeter of the semiconductor die or component.

10. The method of claim 6, further including:
    providing a second carrier;
    leading with the first interconnect structure, mounting the semiconductor die or component to the second carrier;
    removing the first carrier; and
    forming a second interconnect structure over a second surface of the encapsulant opposite the first surface of the encapsulant.

11. The method of claim 10, further including:
    forming a channel through the second interconnect structure, encapsulant, leadframe, and partially through the second carrier; and
    removing the second carrier to singulate the semiconductor die or component.

12. The method of claim 6, further including stacking a plurality of semiconductor die or components within the semiconductor device.

13. The method of claim 6, wherein the bodies of the leadframe are disposed around a perimeter of the semiconductor die or component.

14. A method of making a semiconductor device, comprising:
    providing a first semiconductor die or component;
    disposing a first leadframe around the first semiconductor die or component, the first leadframe including a plate and bodies extending from the plate;
    depositing a first encapsulant over the first leadframe and first semiconductor die or component; and
    forming a first interconnect structure over the first encapsulant and electrically connected to the first leadframe and first semiconductor die or component.

15. The method of claim 14, wherein forming the first interconnect structure includes:
    forming a plurality of conductive vias through the first encapsulant and electrically connected to the bodies of the first leadframe and contact pads on the first semiconductor die or component;
    forming a conductive layer over the first encapsulant; and
    forming an insulating layer over the conductive layer.

16. The method of claim 14, further including:
    providing a second semiconductor die or component;
    disposing a second leadframe around the second semiconductor die or component, the second leadframe having a plate and bodies extending from the plate;
    depositing a second encapsulant over the second leadframe and second semiconductor die or component;
    forming a second interconnect structure over the second encapsulant and electrically connected to the second leadframe and second semiconductor die or component;
    mounting the second semiconductor die or component to the first semiconductor die or component; and
    electrically connecting the second leadframe to the first leadframe.

17. The method of claim 16, further including forming a channel through the first interconnect structure, first and second encapsulants, and first and second leadframes.

18. The method of claim 16, further including:
    forming a first channel through the plate of the first leadframe to physically separate the bodies of the first leadframe; and forming a second channel through the plate of the second leadframe to physically separate the bodies of the second leadframe.

19. The method of claim 16, wherein the bodies of the first leadframe are disposed around a perimeter of the first semiconductor die or component and the bodies of the second leadframe are disposed around a perimeter of the second semiconductor die or component.

* * * * *